United States Patent
Nielsen et al.

(10) Patent No.: US 10,951,189 B2
(45) Date of Patent: Mar. 16, 2021

(54) SIGNAL PROCESSING DEVICE, METHOD AND SPEAKER

(71) Applicant: GOERTEK INC., Weifang (CN)

(72) Inventors: Jakob Birkedal Nielsen, Weifang (CN); Andrew Paddock Bright, Weifang (CN)

(73) Assignee: GOERTEK INC., Weifang (CN)

(*) Notice: Subject to any disclaimer, the term of this patent is extended or adjusted under 35 U.S.C. 154(b) by 0 days.

(21) Appl. No.: 16/064,409

(22) PCT Filed: Mar. 15, 2017

(86) PCT No.: PCT/CN2017/076700
§ 371 (c)(1),
(2) Date: Jun. 20, 2018

(87) PCT Pub. No.: WO2018/157417
PCT Pub. Date: Sep. 7, 2018

(65) Prior Publication Data
US 2020/0099355 A1    Mar. 26, 2020

(30) Foreign Application Priority Data
Mar. 3, 2017 (CN) .......................... 201710123171.7

(51) Int. Cl.
*H03G 9/02* (2006.01)
*H03G 3/32* (2006.01)
(Continued)

(52) U.S. Cl.
CPC .............. *H03G 9/025* (2013.01); *H03G 3/32* (2013.01); *H03G 5/165* (2013.01); *H03G 7/002* (2013.01);
(Continued)

(58) Field of Classification Search
CPC .......... H03G 9/025; H03G 3/32; H03G 5/165; H03G 7/002; H03G 7/007; H03G 9/005; H04R 1/22; H04R 3/04; H04R 25/356
(Continued)

(56) References Cited

U.S. PATENT DOCUMENTS

2005/0207584 A1* 9/2005 Bright .................... H04R 3/007
                                                    381/59
2011/0200209 A1* 8/2011 Yamada ................. H03G 9/025
                                                    381/102
(Continued)

FOREIGN PATENT DOCUMENTS

CN          102158774 A    8/2011
CN          104426495 A    3/2015
(Continued)

OTHER PUBLICATIONS

Matlab & Simulink, "Multiband Dynamic Range Compression", downloaded from Mathworks.com on May 15, 2020. (Year: 2020).*
(Continued)

*Primary Examiner* — Benny T Lee
*Assistant Examiner* — Hafizur Rahman
(74) *Attorney, Agent, or Firm* — Jacob M. Ward; Ward Law Office LLC (57) ABSTRACT

The present invention discloses a signal processing device, a signal processing method and a speaker. The signal processing device comprises a multi-band dynamic range controller, wherein the multi-band dynamic range controller receives an audio signal and includes a first band splitting unit and a resonant band adjustment unit; the first band splitting unit is configured to split the audio signal into multiple bands and obtain at least one resonant band therefrom, which has a resonant frequency band signal in a resonant frequency range of the audio signal; and the
(Continued)

resonant band adjustment unit is configured to adjust the resonant frequency band signal based at least on a resonant band dynamic range control gain and output an adjusted resonant frequency band signal for combination with other band signals into a compression output signal.

15 Claims, 3 Drawing Sheets

(51) Int. Cl.
    *H03G 5/16*             (2006.01)
    *H03G 7/00*             (2006.01)
    *H03G 9/00*             (2006.01)
    *H04R 1/22*             (2006.01)
    *H04R 3/04*             (2006.01)
    *H04R 25/00*           (2006.01)

(52) U.S. Cl.
    CPC .............. *H03G 7/007* (2013.01); *H03G 9/005* (2013.01); *H04R 1/22* (2013.01); *H04R 3/04* (2013.01); *H04R 25/356* (2013.01)

(58) Field of Classification Search
    USPC .......................................................... 333/14
    See application file for complete search history.

(56) References Cited

U.S. PATENT DOCUMENTS

| | | | |
|---|---|---|---|
| 2014/0180458 A1 | 6/2014 | Nayak et al. | |
| 2015/0010168 A1* | 1/2015 | Cheng .................... | H03G 9/025 381/107 |
| 2015/0063600 A1* | 3/2015 | Kono ...................... | H03G 9/025 381/107 |
| 2018/0014121 A1* | 1/2018 | Lawrence .............. | H04R 3/007 |

FOREIGN PATENT DOCUMENTS

| | | |
|---|---|---|
| CN | 104811154 A | 7/2015 |
| CN | 105551500 A | 5/2016 |

OTHER PUBLICATIONS

Triggs, R., "What is frequency response and how does it affect my music", posted on Dec. 26, 2018, on https://www.soundguys.com (Year: 2018).*

* cited by examiner

SIGNAL PROCESSING DEVICE, METHOD AND SPEAKER

CROSS-REFERENCE TO RELATED APPLICATIONS

This application is a National Stage of International Application No. PCT/CN2017/076700, filed on Mar. 15, 2017, which claims priority to Chinese Patent Application No. 201710123171.7, filed on Mar. 3, 2017, both of which are hereby incorporated by reference in their entireties.

FIELD OF THE INVENTION

The present invention relates to the technical field of speaker, and more specifically, to a signal processing device for speaker, a signal processing method for speaker, and a speaker.

BACKGROUND OF THE INVENTION

A speaker device or loudspeaker device is a kind of electro-acoustical transducer, which converts an electrical signal into a sound or sound wave.

A multi-band dynamic range control or multi-band dynamic range controller (MBDRC) can be used between the input and the speaker device of a speaker to adjust the dynamic range of the input audio signal. In the prior art, the MBDRC splits an input audio signal into three bands, i.e. a bass band, a middle band and a treble band. The MBDRC processes the signals of the three bands, respectively, by applying a band-dependent gain to each of them. The processed signals are then combined together to generate an output signal, which will be output to the speaker device. The speaker device is a device in the speaker which acts as a transducer, such as a MEMS device, a membrane and so on.

If an audio signal is too high, the speaker device may be damaged. In order to restrain the audio signal within a limit, a displace protection circuit may be provided before the audio signal reaches the speaker device. In the prior art, the displace protection circuit includes a displacement predictor and a limiting filter LF. The displacement predictor produces a control factor for the limiting filter to retrain the audio signal within the limit.

There is a demand in the art that a new solution for processing the signal of a speaker shall be proposed to address at least one of the problems in the prior art.

SUMMARY OF THE INVENTION

One object of this invention is to provide a new technical solution for a signal processing of a speaker.

According to a first aspect of the present invention, there is provided a signal processing device for a speaker, comprising a multi-band dynamic range controller, wherein the multi-band dynamic range controller receives an audio signal and includes a first band splitting unit and a resonant band adjustment unit; the first band splitting unit is configured to split the audio signal into multiple bands and obtain at least one resonant band therefrom, which has a resonant frequency band signal in a resonant frequency range of the audio signal; and the resonant band adjustment unit is configured to adjust the resonant frequency band signal based at least on a resonant band dynamic range control gain and output an adjusted resonant frequency band signal for combination with other band signals into a compression output signal.

Alternatively or optionally, the resonant frequency range covers a predetermined frequency range with the resonant peak of the speaker as its center frequency.

Alternatively or optionally, the resonant band adjustment unit further includes: a resonant band displacement predictor, which generates a resonant band displacement factor based at least on the resonant frequency band signal, wherein the resonant band displacement factor represents a displacement of a speaker device of the speaker; a resonant band gain calculation unit, which generates the resonant band dynamic range control gain based at least on the resonant frequency band signal and the resonant band displacement factor; and a resonant band adjustment sub-unit, which adjusts the resonant frequency band signal based at least on the resonant band dynamic range control gain.

Alternatively or optionally, the first band splitting unit further splits the audio signal into a bass band, a middle band and a treble band, which have a bass frequency band signal in a bass frequency range, a middle frequency band signal in a middle frequency range and a treble frequency band signal in a treble frequency range of the audio signal, respectively, and wherein the multi-band dynamic range controller further includes: a bass band adjustment unit, which adjusts the bass frequency band signal based at least on a bass band dynamic range control gain and outputs an adjusted bass frequency band signal; a middle band adjustment unit, which adjusts the middle frequency band signal based at least on a middle band dynamic range control gain and outputs an adjusted middle frequency band signal; a treble band adjustment unit, which adjusts the treble frequency band signal based at least on a treble band dynamic range control gain and outputs an adjusted treble frequency band signal; and a first combiner, which combines the adjusted bass frequency band signal, the adjusted resonant frequency band signal, the adjusted middle frequency band signal and the adjusted treble frequency band signal into the compression output signal.

Alternatively or optionally, the first band splitting unit further splits the audio signal into a bass band, a middle band and a treble band, which have a bass frequency band signal in a bass frequency range, a middle frequency band signal in a middle frequency range and a treble frequency band signal in a treble frequency range of the audio signal, respectively, and wherein the multi-band dynamic range controller further includes: a bass band adjustment unit, which adjusts the bass frequency band signal based at least on a bass band dynamic range control gain and outputs an adjusted bass frequency band signal; a lower band combiner, which combines the adjusted bass and resonant frequency band signals into a lower band signal; a lower band displacement predictor, which generates a lower band displacement factor based at least on the lower band signal, wherein the lower band displacement factor represents a displacement of a speaker device of the speaker; a lower band gain calculation unit, which generates a lower band dynamic range control gain based at least on the lower band signal and the lower band displacement factor; a lower band adjustment sub-unit, which adjusts the lower band signal based at least on the lower band dynamic range control gain and output an adjusted lower band signal; a middle band adjustment unit, which adjusts the middle frequency band signal based at least on a middle band dynamic range control gain and outputs an adjusted middle frequency band signal; a treble band adjustment unit, which adjusts the treble frequency control gain and outputs an adjusted treble frequency band signal; and a first combiner, which combines the adjusted lower band signal, the adjusted middle frequency band signal and the adjusted treble frequency band signal into the compression output signal.

Alternatively or optionally, the bass band adjustment unit further includes: a bass band displacement predictor, which generates a bass band displacement factor based at least on the bass frequency band signal, wherein the bass band displacement factor represents a displacement of a speaker device of the speaker; and a bass band gain calculation unit, which generates the bass band dynamic range control gain based at least on the bass frequency band signal and the bass band displacement factor; a bass band adjustment sub-unit, which adjusts the bass frequency band signal based at least on the bass band dynamic range control gain.

Alternatively or optionally, the middle band adjustment unit further includes: a middle band gain calculation unit, which generates the middle band dynamic range control gain for the middle frequency band signal; and a middle band adjustment sub-unit, which adjusts the middle frequency band signal based at least on the middle band dynamic range control gain.

Alternatively or optionally, the treble band adjustment unit further includes: a treble band gain calculation unit, which generates the treble band dynamic range control gain for the treble frequency band signal; and a treble band adjustment sub-unit, which adjusts the treble frequency band signal based at least on the treble band dynamic range control gain.

Alternatively or optionally, the signal processing device further comprises a displacement protection unit, wherein the displacement protection unit includes: a second band splitting unit, which splits the compression output signal into a lower band signal and a higher band signal, wherein the lower band signal includes a bass band and the resonant band of the compression output signal; a lower band adjustment unit adjusts the lower band signal and outputs a lower band adjusted signal within a limit for the speaker; and a second combiner, which combines the lower band adjusted signal and the higher band signal into an output signal.

Alternatively or optionally, the lower band adjustment unit includes: a lower band displacement predictor, which generates a lower band displacement factor based at least on the lower band signal, wherein the lower band displacement factor represents a displacement of a speaker device of the speaker; a lower band gain calculation unit, which generates a lower band dynamic range control gain based at least on the lower band signal and the lower band displacement factor; and a lower band adjustment sub-unit, which adjusts the lower band signal based at least on the lower band dynamic range control gain.

According to a second aspect of the present invention, there is provided a speaker, including: a input unit, which receives an audio signal; a signal processing device for speaker according to an embodiment of this invention; and a speaker device which receives an output signal from the signal processing device and transforms it into sound.

According to a third aspect of the present invention, there is provided an electronics apparatus, comprising a speaker according to an embodiment.

According to a fourth aspect of the present invention, there is provided a signal processing method for a speaker, comprising: receiving an audio signal; splitting the audio signal into multiple bands and obtaining at least one resonant band therefrom, which has a resonant frequency band signal in a resonant frequency range of the audio signal; adjusting the resonant frequency band signal based at least on a resonant band dynamic range control gain; and outputting an adjusted resonant frequency band signal for combination with other band signals into a compression output signal.

Alternatively or optionally, the resonant frequency range covers a predetermined frequency range with the resonant peak of the speaker as its center frequency.

Alternatively or optionally, the signal processing method further comprises: generating a resonant band displacement factor based at least on the resonant frequency band signal, wherein the resonant band displacement factor represents a displacement of a speaker device of the speaker; generating the resonant band dynamic range control gain based at least on the resonant frequency band signal and the resonant band displacement factor; and adjusting the resonant frequency band signal based at least on the resonant band dynamic range control gain.

Alternatively or optionally, the audio signal are split into a bass band, a middle band and a treble band, which have a bass frequency band signal in a bass frequency range, a middle frequency band signal in a middle frequency range and a treble frequency band signal in a treble frequency range of the audio signal, respectively, and wherein the method further comprises: adjusting the bass frequency band signal based at least on a bass band dynamic range control gain and outputs an adjusted bass frequency band signal; adjusting the middle frequency band signal based at least on a middle band dynamic range control gain and outputs an adjusted middle frequency band signal; adjusting the treble frequency band signal based at least on a treble band dynamic range control gain and outputs an adjusted treble frequency band signal; and combining the adjusted bass frequency band signal, the adjusted resonant frequency band signal, the adjusted middle frequency band signal and the adjusted treble frequency band signal into the compression output signal.

Alternatively or optionally, the audio signal is split into a bass band, a middle band and a treble band, which have a bass frequency band signal in a bass frequency range, a middle frequency band signal in a middle frequency range and a treble frequency band signal in a treble frequency range of the audio signal, respectively, and wherein the method further comprises: adjusting the bass frequency band signal based at least on a bass band dynamic range control gain and outputs an adjusted bass frequency band signal; combining the adjusted bass and resonant frequency band signals into a lower band signal; generating a lower band displacement factor based at least on the lower band signal, wherein the lower band displacement factor represents a displacement of a speaker device of the speaker; generating a lower band dynamic range control gain based at least on the lower band signal and the lower band displacement factor; adjusting the lower band signal based at least on the lower band dynamic range control gain and output an adjusted lower band signal; adjusting the middle frequency band signal based at least on a middle band dynamic range control gain and outputs an adjusted middle frequency band signal; adjusting the treble frequency band signal based at least on a treble band dynamic range control gain and outputs an adjusted treble frequency band signal; and combining the adjusted lower band signal, the adjusted middle frequency band signal and the adjusted treble frequency band signal into the compression output signal.

Alternatively or optionally, adjusting the bass frequency band signal further includes: generating a bass band displacement factor based at least on the bass frequency band signal, wherein the bass band displacement factor represents a displacement of a speaker device of the speaker; and generating the bass band dynamic range control gain based at least on the bass frequency band signal and the bass band displacement factor; adjusting the bass frequency band signal based at least on the bass band dynamic range control gain.

Alternatively or optionally, adjusting the middle frequency band signal further includes: generating the middle band dynamic range control gain for the middle frequency band signal; and adjusting the middle frequency band signal based at least on the middle band dynamic range control gain.

Alternatively or optionally, adjusting the treble frequency band signal further includes: generating the treble band dynamic range control gain for the treble frequency band signal; and adjusting the treble frequency band signal based at least on the treble band dynamic range control gain.

Alternatively or optionally, the signal processing method further comprises: splitting the compression output signal into a lower band signal and a higher band signal, wherein the lower band signal includes a bass band and the resonant band of the compression output signal; adjusting the lower band signal and outputting a lower band adjusted signal within a limit for the speaker; and combining the lower band adjusted signal and the higher band signal into an output signal.

Alternatively or optionally, adjusting the lower band signal includes: generating a lower band displacement factor based at least on the lower band signal, wherein the lower band displacement factor represents a displacement of a speaker device of the speaker; generating a lower band dynamic range control gain based at least on the lower band signal and the lower band displacement factor; and adjusting the lower band signal based at least on the lower band dynamic range control gain.

According to an embodiment of this invention, the present invention can improve the performance of a speaker.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples will be described with reference to the drawings below.

Figure 7:
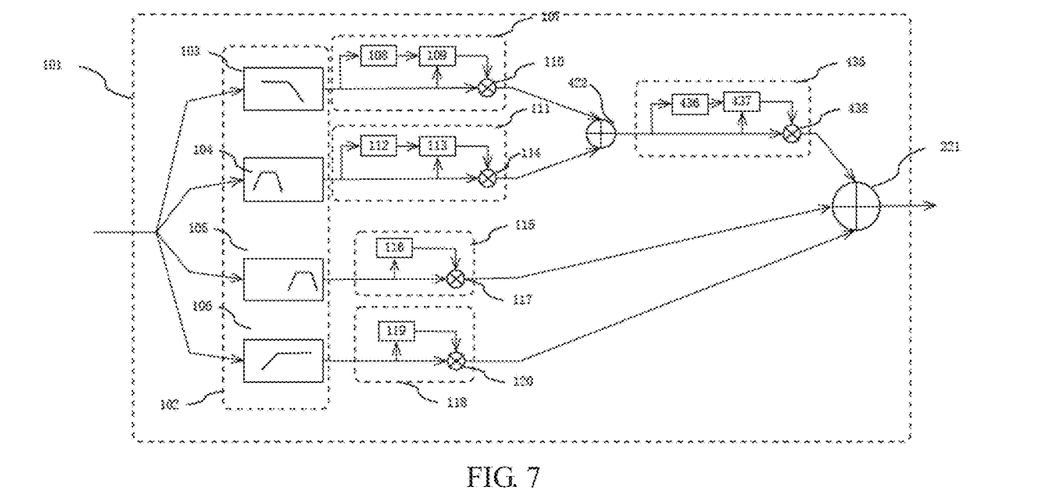
FIG. 7 shows a schematic block diagram of a multi-band dynamic range controller according to another embodiment of the present invention.

FIG. 7 shows a schematic block diagram of a signal processing device for a speaker according to an embodiment of the present invention.

Figure 1:
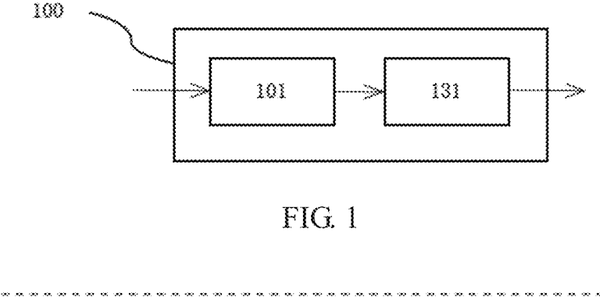
FIG. 1 shows a schematic block diagram of a signal processing device for speaker according to an embodiment of the present invention.

As shown in FIG. 1, the signal processing device 100 may includes a multi-band dynamic range controller MBDRC 101 and a displacement protection unit 131.

Although it is shown in FIG. 1 that the signal processing device 100 includes both of the MBDRC 101 and a displacement protection unit 131, it can be understood by a technician that it can just include one of them. The structures of the MBDRC 101 and a displacement protection unit 131 will be described with reference to FIGS. 2 and 3, respectively.

Figure 2:
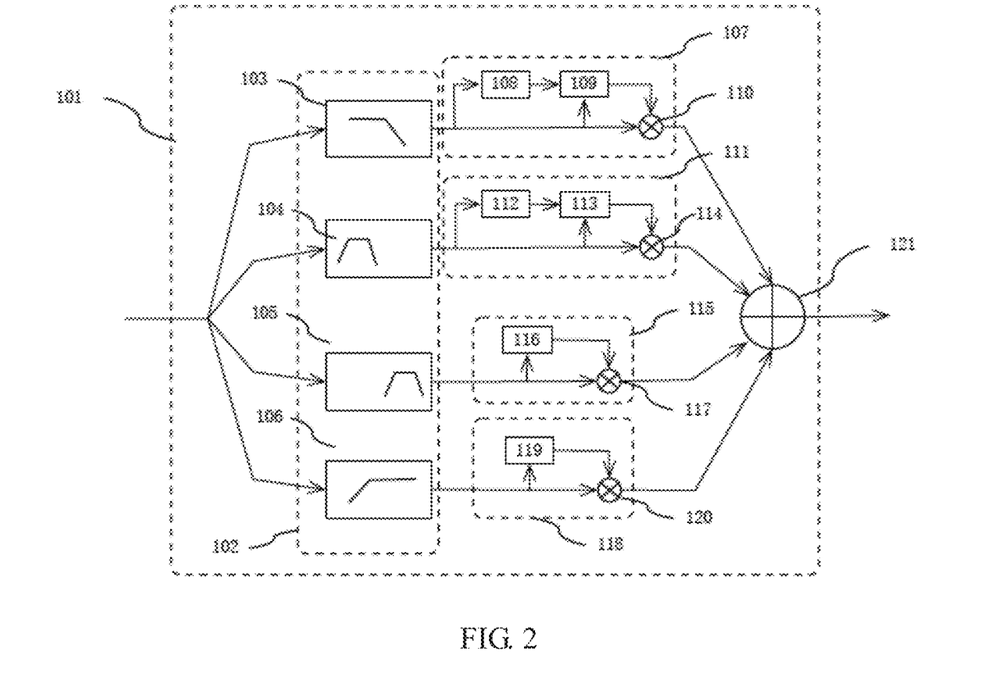
FIG. 2 shows a schematic block diagram of a multi-band dynamic range controller according to an embodiment of the present invention.

FIG. 2 shows a schematic block diagram of a multi-band dynamic range controller according to an embodiment of the present invention.

The multi-band dynamic range controller 101 receives an audio signal. As shown in FIG. 2, it can include a first band splitting unit 102 and a resonant band adjustment unit 111.

The first band splitting unit 102 is configured to split the audio signal into into multiple bands and obtain at least one resonant band therefrom. The resonant band has a resonant frequency band signal in a resonant frequency range of the audio signal. For example, the resonant frequency range includes the resonant components of the audio signal. In an example, the resonant frequency range covers a predetermined frequency range with the resonant peak of the speaker as its center frequency.

The resonant band adjustment unit 111 receives the resonant frequency band signal from the first band splitting unit 102. It is configured to adjust the resonant frequency band signal based at least on a resonant band dynamic range control gain and outputs an adjusted resonant frequency band signal for combination with other band signals into a compression output signal.

In this embodiment, the resonant band is taken out of the audio signal and is processed separately. Because the speaker is sensitive with the resonant frequency band, this approach can improve the performance of the speaker. It can be understood by a person skilled in the art, the other bands of the audio signal can be processed in a conventional manner.

In an embodiment, as shown in FIG. 2, the resonant band adjustment unit 111 further includes: a resonant band displacement predictor 112, a resonant band gain calculation unit 113 and a resonant band adjustment sub-unit 114.

The resonant band displacement predictor 112 generates a resonant band displacement factor based at least on the resonant frequency band signal. The resonant band displacement factor represents a displacement of a speaker device of the speaker. The resonant band gain calculation unit 113 receives the resonant band displacement factor and the resonant frequency band signal. It generates the resonant band dynamic range control gain based at least on the resonant frequency band signal and the resonant band displacement factor.

The resonant band adjustment sub-unit 114 adjusts the resonant frequency band signal based at least on the resonant band dynamic range control gain. It outputs the adjusted resonant frequency band signal.

In FIG. 2, the resonant band adjustment sub-unit 114 is shown as a multiplying unit. For example, it can be an amplifier and the resonant band dynamic range control gain is input into the control terminal of the amplifier to amplify the resonant frequency band signal.

In addition, the resonant band adjustment sub-unit 114 can be other circuit. For example, the resonant band adjustment sub-unit 114 can be an adding unit. In this case, the resonant band dynamic range control gain can be a compensation value, and adding or subtracting it can adjust the resonant frequency band signal, i.e. by adding the compensation value with the resonant frequency band signal or subtracting the compensation value from the resonant frequency band signal.

In this embodiment, since a speaker is most sensitive with regards to a displacement in the resonant frequency band, it is taken out of the audio signal and is processed separately. As a result, the resonant frequency band signal can be limited precisely, without an over-limiting to the bass band.

For example, the first band splitting unit 102 can split the audio signal into a bass band, a resonant band, a middle band and a treble band. As shown in FIG. 2, the first band splitting unit 102 may comprise a first, second, third and fourth sub-units 103, 104, 105, 106. The first, second, third and fourth sub-units 103, 104, 105, 106 split the input audio signal and generate the bass band, the resonant band, the middle band and the treble band.

For example, similar with the resonant band, the bass band, the middle band and the treble band have a bass frequency band signal in a bass frequency range, a middle frequency band signal in a middle frequency range and a treble frequency band signal in a treble frequency range of the audio signal, respectively.

Generally, the frequencies in the bass frequency range are lower than those in the resonant frequency range, the frequencies in the resonant frequency range are lower than those in the middle frequency range, and the frequencies in the middle frequency range is lower than those in the treble frequency range.

In an embodiment, as shown in FIG. 2, the multi-band dynamic range controller 101 can further include a bass band adjustment unit 107, a resonant band adjustment unit 111, a middle band adjustment unit 115, a treble band adjustment unit 118 and a first combiner 121.

The bass band adjustment unit 107 adjusts the bass frequency band signal based at least on a bass band dynamic range control gain and outputs an adjusted bass frequency band signal.

For example, the bass band adjustment unit 107 may include a bass band displacement predictor 108, a bass band gain calculation unit 109 and a bass band adjustment sub-unit 110.

The bass band displacement predictor 108 generates a bass band displacement factor based at least on the bass frequency band signal. The bass band displacement factor represents a displacement of a speaker device of the speaker. The bass band gain calculation unit 109 generates the bass band dynamic range control gain based at least on the bass frequency band signal and the bass band displacement factor. The bass band adjustment sub-unit 110 adjusts the bass frequency band signal based at least on the bass band dynamic range control gain. Then, it outputs the adjusted bass frequency band signal.

Figure 6:
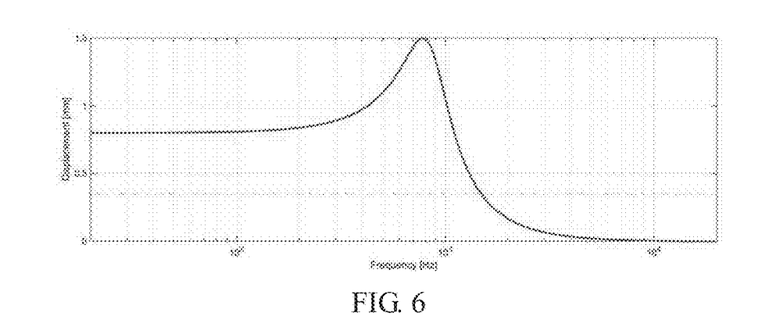
FIG. 6 is a graph schematically showing the relationship between the displacement and the frequency of an input audio signal.

As shown in FIG. 6, a higher displacement of the speaker device takes place at the bass band and the resonant band. So, in the embodiment, the bass band displacement predictor 108 and the resonant band displacement predictor 112 are integrated into the processing of the bass and resonant bands of the MBDRC 101.

In the embodiment, the bass band can be boosted or otherwise be attenuated to compensate for the low frequency roll-off of the speaker. This approach ensures to obtain a bass boost (or at least only a modest bass attenuation) even though the source audio signal has a lot of energy in the resonant frequency region.

The middle band adjustment unit 115 adjusts the middle frequency band signal based at least on a middle band dynamic range control gain and outputs an adjusted middle frequency band signal.

For example, the middle band adjustment unit 115 includes a middle band gain calculation unit 116 and a middle band adjustment sub-unit 117. The middle band gain calculation unit 116 generates the middle band dynamic range control gain for the middle frequency band signal. The middle band adjustment sub-unit 117 adjusts the middle frequency band signal based at least on the middle band dynamic range control gain. It outputs the adjusted middle frequency band signal.

The treble band adjustment unit 118 adjusts the treble frequency band signal based at least on a treble band dynamic range control gain and outputs an adjusted treble frequency band signal.

For example, the treble band adjustment unit 118 includes a treble band gain calculation unit 119 and a treble band adjustment sub-unit 120. The treble band gain calculation unit 119 generates the treble band dynamic range control gain for the treble frequency band signal. The treble band adjustment sub-unit 120 adjusts the treble frequency band signal based at least on the treble band dynamic range control gain. It outputs the adjusted treble frequency band signal.

For example, the adjustments of the bass, middle and treble band adjustment units 107, 115, 118 may be similar as that of the resonant band adjustment unit 111. For example, the bass, middle treble band adjustment sub-units 110, 117, 120 may be implemented in a similar manner as the resonant band adjustment sub-unit 114 and thus the detailed descriptions thereof are omitted.

The first combiner 121 combines the adjusted bass frequency band signal, the adjusted resonant frequency band signal, the adjusted middle frequency band signal and the adjusted treble frequency band signal into the compression output signal. For example, the adjusted bass frequency band signal, the adjusted resonant frequency band signal, the adjusted middle frequency band signal and the adjusted treble frequency band signal are added up, and the resultant sum signal is the compression output signal.

FIG. 7 shows a schematic block diagram of a multi-band dynamic range controller according to another embodiment of the present invention.

The difference of the embodiments of FIG. 7 and FIG. 2 lies in that the multi-band dynamic range controller 101 further comprises a displacement protection sub-unit 435. The repetitive description for parts in FIG. 7 will be omitted.

As shown in FIG. 7, the multi-band dynamic range controller 101 further includes a lower band combiner 422. The lower band combiner 422 combines the adjusted bass and resonant frequency band signals output from the bass and resonant band adjustment units 107, 111 into a lower band signal.

The displacement protection sub-unit 435 receives the lower band signal. The displacement protection sub-unit 435 includes a lower band displacement predictor 436, a lower band gain calculation unit 437 and a lower band adjustment sub-unit 438. The lower band displacement predictor 436 generates a lower band displacement factor based at least on the lower band signal. The lower band displacement factor represents a displacement of a speaker device of the speaker. The lower band gain calculation unit 437 generates a lower band dynamic range control gain based at least on the lower band signal and the lower band displacement factor. The lower band adjustment sub-unit 438 adjusts the lower band signal based at least on the lower band dynamic range control gain and output an adjusted lower band signal.

The first combiner 221 combines the adjusted lower band signal, the adjusted middle frequency band signal and the adjusted treble frequency band signal from the middle and treble band adjustment units 115, 118 into the compression output signal.

The compression output signal may be passed to another circuit for further processing or directly be passed to a speaker device.

For example, the inventor found that if in the prior art a traditional MBDRC and a displacement protection unit is combined by simply serially cascading them, then both the MBDRC and the displacement protection unit will apply compression to the audio signal at the highest playback level of the signal. This can result in an over-protection of the displacement and/or a poor sounding pumping of the audio signal. Some technicians try to integrate the speaker protection unit with a dynamic processor to reduce the influence of the path between the speaker protection unit and the dynamic processor. In practice, this may still involve the above-said problem because the speaker protection unit and the dynamic processor are separate in logic. The speaker protection unit produces a control parameter independently to the dynamic processor.

In the embodiment, the displacement prediction unit is integrated into the MBDRC, especially, in the processing in one or more low frequency band such as the bass band and the resonant band. In this regard, the dynamic range controller per se will take the displacement of a speaker device into consideration.

Optionally, this allows the dynamic range control and displacement protection limiting to be performed by the same audio processing sub-component, such as the bass band adjustment unit 107 or the resonant band adjustment unit 111. This can relieve the gain pumping problems that will occur in serially cascaded processing blocks and/or the unnecessary over protection of the displacement.

This will provide a better sound quality and the speaker is easier to be tuned and integrated into an audio system.

Figure 3:
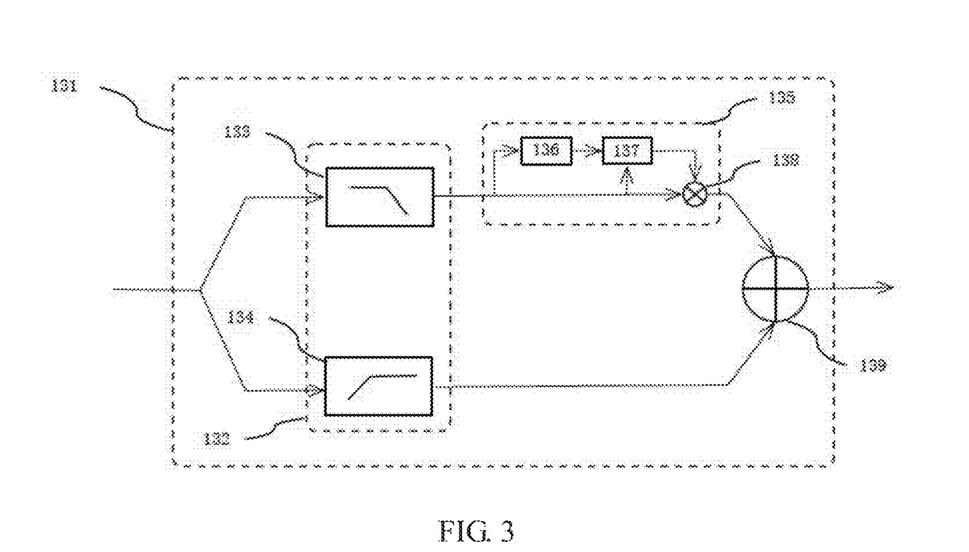
FIG. 3 shows a schematic block diagram of a displacement protection unit according to an embodiment of the present invention.

FIG. 3 shows a schematic block diagram of a displacement protection unit according to an embodiment of the present invention.

The MBDRC 101 and the displacement protection unit 131 can function individually or can be combined together in a speaker.

In this embodiment, a displacement protection unit 131 is introduced to further adjust the displacement. The displacement protection unit 131 may be used to further ensure that the output signal will not exceed the limit of the speaker device. As shown in FIG. 3, the displacement protection unit 131 includes a second band splitting unit 132, a lower band adjustment unit 135 and a second combiner 139.

The second band splitting unit 132 splits an input signal such as the compression output signal into a lower band signal and a higher band signal. For example, the second band splitting unit 132 comprises a first sub-unit 133 and a second sub-unit 134. The first sub-unit 133 produces the lower band signal and the second sub-unit 134 produces the higher band signal. The frequency of the lower band signal is lower than that of the higher band signal. The lower band signal includes a bass band and the resonant band of the compression output signal.

The lower band adjustment unit 135 adjusts the lower band signal and outputs a lower band adjusted signal within a limit for the speaker.

For example, the lower band adjustment unit 135 includes a lower band displacement predictor 136, a lower band gain calculation unit 137 and a lower band adjustment sub-unit 138. The lower band displacement predictor 136 generates a lower band displacement factor based at least on the lower band signal. The lower band displacement factor represents a displacement of a speaker device of the speaker. The lower band gain calculation unit 137 generates a lower band dynamic range control gain based on the lower band signal and the lower band displacement factor. The lower band adjustment sub-unit 138 adjusts the lower band signal based at least on the lower band dynamic range control gain. It outputs the lower band adjusted signal. The adjustment of the lower band adjustment unit 135 may be similar as that of the resonant band adjustment unit 110 and thus the detailed description thereof is omitted.

The second combiner 139 combines the lower band adjusted signal and the higher band signal into an output signal.

In the embodiment, the lower band adjustment unit 135 can have a similar structure with those of the bass and resonant band adjustment units 107, 110. So, the consistency for them will be improved. It may be easier to configure these units.

This further displacement limiting by the displacement protection unit 131 on the output signal from the MBDRC (in a frequency range covering both bass and resonant frequency region) will ensure that the output signal does not cause a displacement to exceed the allowed limit.

Those spilled in the art can appreciate that the above components of signal processing device 100 may be implemented in various manners. For example, a processor may be configured with instructions to implement the signal processing device 100. For example, those instructions may be stored in ROM, and may be loaded from the ROM to a programmable device when the device is powered on, to implement components thereof. For example, the signal processing device 100 may be solidified in a dedicated device such as an ASIC. The signal processing device 100 may be divided into two or more stand-alone units. The signal processing device 100 can be implemented by one or more of the above manners.

It is well known that for signal processing, the software implementation and hardware implementation are equivalent. That is, the above components can be implemented by software, hardware or a combination thereof. Based on the teaching of this specification, a technician can know how to implement these components and he can choose to implement them by software, hardware or a combination thereof. The choice may be dependent on the non-technical factors such as cost, size, speed, availability and so on of the devices in the market.

Figure 8:
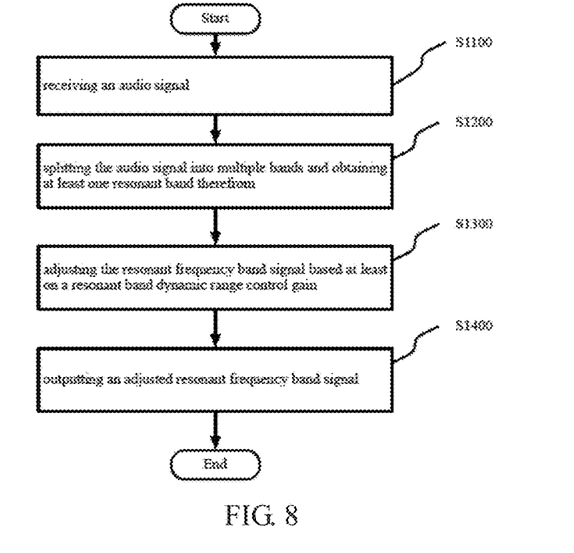
FIG. 8 shows a schematic flow chart of a signal processing method for a speaker according to an embodiment of the present invention.

In another embodiment, a signal processing method for a speaker implemented in the above signal processing device for a speaker is provided. FIG. 8 shows a schematic flow chart of a signal processing method for a speaker according to an embodiment of the present invention.

As shown in FIG. 8, in step S1100, an audio signal is received.

In step S1200, the audio signal is split into multiple bands and obtaining at least one resonant band therefrom, which has a resonant frequency band signal in a resonant frequency range of the audio signal.

In step S1300, the resonant frequency band signal is adjusted based at least on a resonant band dynamic range control gain.

In step S1400, an adjusted resonant frequency band signal is output for combination with other band signals into a compression output signal.

Here, the repetitive features as those in the above embodiments are omitted.

Figure 4:
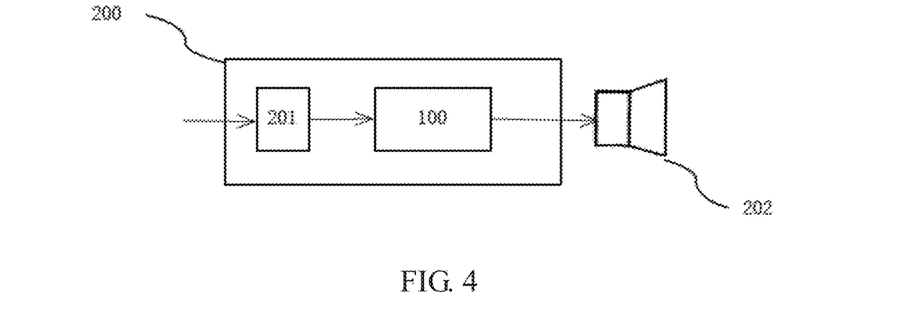
FIG. 4 shows a schematic block diagram of a speaker according to an embodiment of the present invention.

FIG. 4 shows a schematic block diagram of a speaker according to an embodiment of the present invention.

As shown in FIG. 4, the speaker 200 includes an input unit 201 which receives an audio signal, a signal processing device for speaker 100 according to any of the above embodiments and a speaker device 202 which receives an output signal from the signal processing device 100 and transforms it into sound.

Figure 5:
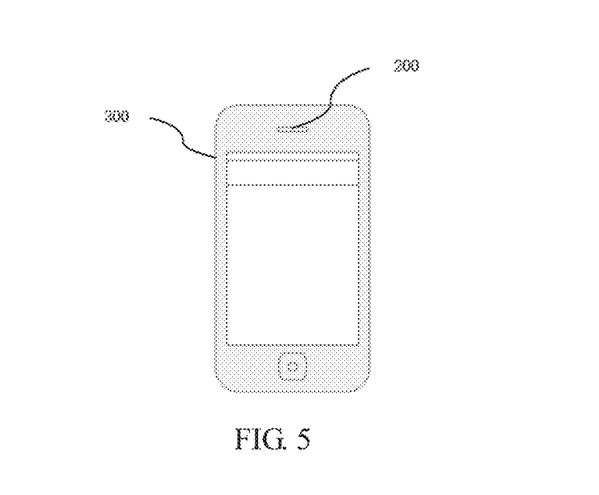
FIG. 5 shows a schematic block diagram of an electronics apparatus according to an embodiment of the present invention.

FIG. 5 shows a schematic block diagram of an electronics apparatus according to an embodiment of the present invention.

As shown in FIG. 5, the electronics apparatus 300 comprises a speaker 200. The speaker 200 may be that shown in FIG. 4. Although the electronics apparatus 300 is shown as a smart phone in FIG. 5, it can be other electronics apparatus, such as a sound box, music player, a car sound system and so on.

Although some specific embodiments of the present invention have been demonstrated in detail with examples, it should be understood by a person skilled in the art that the above examples are only intended to be illustrative but not to limit the scope of the present invention.

What is claimed is:

1. A signal processing device for a speaker, comprising a multi-band dynamic range controller, wherein the multi-band dynamic range controller receives an audio signal and includes a first band splitting unit and a resonant band adjustment unit;

the first band splitting unit is configured to split the audio signal into multiple bands and obtain at least one resonant band therefrom, which has a resonant frequency band signal in a resonant frequency range of the audio signal;

the resonant band adjustment unit is configured to adjust the resonant frequency band signal based at least on a resonant band dynamic range control gain and output an adjusted resonant frequency band signal for combination with other band signals into a compression output signal; and the resonant frequency range covers a predetermined frequency range with the resonant peak of the speaker as its center frequency.

2. The signal processing device according to claim 1, further comprising a displacement protection unit, wherein the displacement protection unit includes:

a second band splitting unit, which splits the compression output signal into a lower band signal and a higher band signal, wherein the lower band signal includes a bass band and the resonant band of the compression output signal;

a lower band adjustment unit adjusts the lower band signal and outputs a lower band adjusted signal within a limit for the speaker; and a second combiner, which combines the lower band adjusted signal and the higher band signal into an output signal;

wherein the lower band adjustment unit includes:

a lower band displacement predictor, which generates a lower band displacement factor based at least on the lower band signal, wherein the lower band displacement factor represents a displacement of a speaker device of the speaker;

a lower band gain calculation unit, which generates a lower band dynamic range control gain based at least on the lower band signal and the lower band displacement factor; and a lower band adjustment sub-unit; which adjusts the lower band signal based at least on the lower band dynamic range control gain.

3. The signal processing device according to claim 1, wherein the resonant band adjustment unit further includes:

a resonant band displacement predictor, which generates a resonant band displacement factor based at least on the resonant frequency band signal, wherein the resonant band displacement factor represents a displacement of a speaker device of the speaker;

a resonant band gain calculation unit, which generates the resonant band dynamic range control gain based at least on the resonant frequency band signal and the resonant band displacement factor; and a resonant band adjustment sub-unit, which adjusts the resonant frequency band signal based at least on the resonant band dynamic range control gain.

4. A speaker, including:

an input unit, which receives an audio signal;

a signal processing device for speaker according to claim 1; and a speaker device which receives an output signal from the signal processing device and transforms it into sound.

5. The signal processing device according to claim 1, wherein the first band splitting unit further splits the audio signal into a bass band, a middle band and a treble band, which have a bass frequency band signal in a bass frequency range, a middle frequency band signal in a middle frequency range and a treble frequency band signal in a treble frequency range of the audio signal, respectively, and wherein the multi-band dynamic range controller further includes:

a bass band adjustment unit, which adjusts the bass frequency band signal based at least on a bass band dynamic range control gain and outputs an adjusted bass frequency band signal;

a middle band adjustment unit, which adjusts the middle frequency band signal based at least on a middle band dynamic range control gain and outputs an adjusted middle frequency band signal;

a treble band adjustment unit, which adjusts the treble frequency band signal based at least on a treble band dynamic range control gain and outputs an adjusted treble frequency band signal; and a first combiner, which combines the adjusted bass frequency band signal, the adjusted resonant frequency band signal; the adjusted middle frequency band signal and the adjusted treble frequency band signal into the compression output signal or, wherein the multi-band dynamic range controller further includes:

a bass band adjustment unit, which adjusts the bass frequency band signal based at least on a bass band dynamic range control gain and outputs an adjusted bass frequency band signal;

a lower band combiner, which combines the adjusted bass and resonant frequency band signals into a lower band signal;

a lower band displacement predictor, which generates a lower band displacement factor based at least on the lower band signal, wherein the lower band displacement factor represents a displacement of a speaker device of the speaker;

a lower band gain calculation unit, which generates a lower band dynamic range control gain based at least on the lower band signal and the lower band displacement factor;

a lower band adjustment sub-unit, which adjusts the lower band signal based at least on the lower band dynamic range control gain and output an adjusted lower band signal;

a middle band adjustment unit, which adjusts the middle frequency band signal based at least on a middle band dynamic range control gain and outputs an adjusted middle frequency band signal;

a treble band adjustment unit, which adjusts the treble frequency band signal based at least on a treble band dynamic range control gain and outputs an adjusted treble frequency band signal; and a first combiner, which combines the adjusted lower band signal, the adjusted middle frequency band signal and the adjusted treble frequency band signal into the compression output signal.

6. The signal processing device according to claim 5, wherein the bass band adjustment unit further includes:

a bass band displacement predictor, which generates a bass band displacement factor based at least on the bass frequency band signal, wherein the bass band displacement factor represents a displacement of a speaker device of the speaker;

a bass band gain calculation unit, which generates the bass band dynamic range control gain based at least on the bass frequency band signal and the bass band displacement factor; and a bass band adjustment sub-unit, which adjusts the bass frequency band signal based at least on the bass band dynamic range control gain.

7. The signal processing device according to claim 5, wherein the middle band adjustment unit further includes:

a middle band gain calculation unit, which generates the middle band dynamic range control gain for the middle frequency band signal; and a middle band adjustment sub-unit, which adjusts the middle frequency band signal based at least on the middle band dynamic range control gain.

8. The signal processing device according to claim 5, wherein the treble band adjustment unit further includes:

a treble band gain calculation unit, which generates the treble band dynamic range control gain for the treble frequency band signal; and a treble band adjustment sub-unit, which adjusts the treble frequency band signal based at least on the treble band dynamic range control gain.

9. A signal processing method for a speaker, comprising:

receiving an audio signal;

splitting the audio signal into multiple bands and obtaining at least one resonant band therefrom, which has a resonant frequency band signal in a resonant frequency range of the audio signal;

adjusting the resonant frequency band signal based at least on a resonant band dynamic range control gain; and outputting an adjusted resonant frequency band signal for combination with other band signals into a compression output signal;

wherein the resonant frequency range covers a predetermined frequency range with the resonant peak of the speaker as its center frequency.

10. The signal processing method according to claim 9, further comprising:

splitting the compression output signal into a lower band signal and a higher band signal, wherein the lower band signal includes a bass band and the resonant band of the compression output signal;

adjusting the lower band signal and outputting a lower band adjusted signal within a limit for the speaker; and combining the lower band adjusted signal and the higher band signal into an output signal;

wherein adjusting the lower band signal includes:

generating a lower band displacement factor based at least on the lower band signal, wherein the lower band displacement factor represents a displacement of a speaker device of the speaker;

generating a lower band dynamic range control gain based at least on the lower band signal and the lower band displacement factor; and adjusting the lower band signal based at least on the lower band dynamic range control gain.

11. The signal processing method according to claim 9, wherein the audio signal are split into a bass band, a middle band and a treble band, which have a bass frequency band signal in a bass frequency range; a middle frequency band signal in a middle frequency range and a treble frequency band signal in a treble frequency range of the audio signal, respectively, and wherein the method further comprises:
adjusting the bass frequency band signal based at least on a bass band dynamic range control gain and outputting an adjusted bass frequency band signal;
adjusting the middle frequency band signal based at least on a middle band dynamic range control gain and outputting an adjusted middle frequency band signal;
adjusting the treble frequency band signal based at least on a treble band dynamic range control gain and outputting an adjusted treble frequency band signal; and
combining the adjusted bass frequency band signal, the adjusted resonant frequency band signal, the adjusted middle frequency band signal and the adjusted treble frequency band signal into the compression output signal; or
wherein the method further comprises:
adjusting the bass frequency band signal based at least on a bass band dynamic range control gain and outputting an adjusted bass frequency band signal;
combining the adjusted bass and resonant frequency band signals into a lower band signal;
generating a lower band displacement factor based at least on the lower band signal, wherein the lower band displacement factor represents a displacement of a speaker device of the speaker;
generating a lower band dynamic range control gain based at least on the lower band signal and the lower band displacement factor;
adjusting the lower band signal based at least on the lower band dynamic range control gain and outputting an adjusted lower band signal;
adjusting the middle frequency band signal based at least on a middle band dynamic range control gain and outputting an adjusted middle frequency band signal;
adjusting the treble frequency band signal based at least on a treble band dynamic range control gain and outputting an adjusted treble frequency band signal; and
combining the adjusted lower band signal; the adjusted middle frequency band signal and the adjusted treble frequency band signal into the compression output signal.

12. The signal processing method according to claim 11, wherein adjusting the bass frequency band signal further includes:
generating a bass band displacement factor based at least on the bass frequency band signal, wherein the bass band displacement factor represents a displacement of a speaker device of the speaker;
generating the bass band dynamic range control gain based at least on the bass frequency band signal and the bass band displacement factor; and
adjusting the bass frequency band signal based at least on the bass band dynamic range control gain.

13. The signal processing method according to claim 11, wherein adjusting the middle frequency band signal further includes:
generating the middle band dynamic range control gain for the middle frequency band signal; and
adjusting the middle frequency band signal based at least on the middle band dynamic range control gain.

14. The signal processing method according to claim 11, wherein adjusting the treble frequency band signal further includes:
generating the treble band dynamic range control gain for the treble frequency band signal; and
adjusting the treble frequency band signal based at least on the treble band dynamic range control gain.

15. The signal processing method according to claim 9, further comprising:
generating a resonant band displacement factor based at least on the resonant frequency band signal, wherein the resonant band displacement factor represents a displacement of a speaker device of the speaker;
generating the resonant band dynamic range control gain based at least on the resonant frequency band signal and the resonant band displacement factor; and
adjusting the resonant frequency band signal based at least on the resonant band dynamic range control gain.

* * * * *